United States Patent [19]

Onozawa

[11] Patent Number: 4,990,461
[45] Date of Patent: Feb. 5, 1991

[54] METHOD OF MAKING A SEMICONDUCTOR INTEGRATED CIRCUIT DEVICE HAVING RESISTANCE ELEMENTS

[75] Inventor: Kazunori Onozawa, Takasaki, Japan

[73] Assignee: Hitachi, Ltd., Tokyo, Japan

[21] Appl. No.: 386,696

[22] Filed: Jul. 31, 1989

[30] Foreign Application Priority Data

Aug. 12, 1988 [JP] Japan .................................. 63-201451

[51] Int. Cl.$^5$ ............................................. H01L 27/00
[52] U.S. Cl. .......................................... 437/47; 437/47; 437/60; 437/918; 437/31; 437/34
[58] Field of Search ................... 437/47, 60, 918, 31, 437/34

[56] References Cited

U.S. PATENT DOCUMENTS

| | | | |
|---|---|---|---|
| 4,208,781 | 1/1980 | Rao | 437/41 |
| 4,256,515 | 3/1981 | Miles | 437/20 |
| 4,367,580 | 1/1983 | Guterman | 437/43 |
| 4,370,798 | 2/1983 | Lien | 437/47 |
| 4,734,382 | 3/1988 | Krishna | 437/31 |
| 4,800,171 | 1/1989 | Ivanmesh | 437/31 |

FOREIGN PATENT DOCUMENTS 166135 7/1986 Japan .................................. 437/918

OTHER PUBLICATIONS

*Nikkei Electronics*, Mar. 10, 1986 pp. 199–217.
Nikkei Electronics, Aug. 12, 1985, pp. 187–195.

Primary Examiner—Brian E. Hearn
Assistant Examiner—Gordon V. Hugo
Attorney, Agent, or Firm—Antonelli, Terry, Stout & Kraus

[57] ABSTRACT

A semiconductor integrated circuit device having resistance elements having reduced fluctuation of their resistance values and a fabrication method thereof are disclosed.

More definitely, a protective film made of a gate electrode material of MISFETs formed on the main plane of a semiconductor substrate is disposed through an insulator film on the upper surface of the resistance elements comprising a semiconductor region which is formed by introducing an impurity of a first conductivity type into the main plane of the same semiconductor substrate.

6 Claims, 13 Drawing Sheets

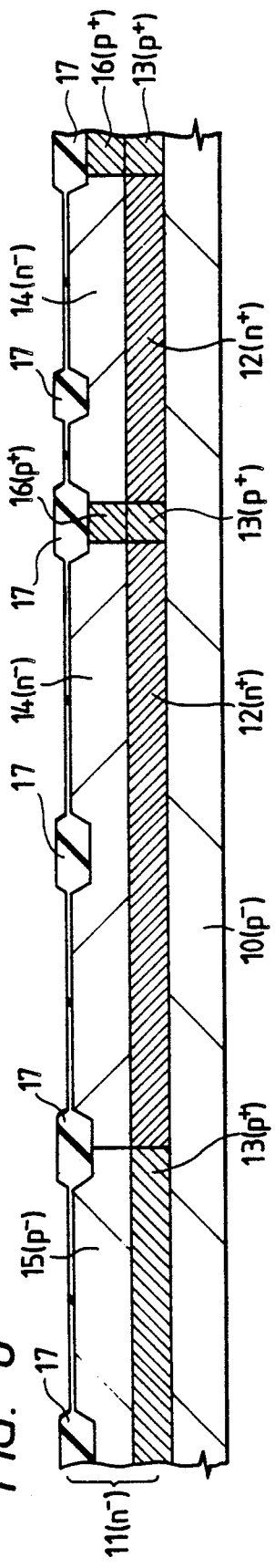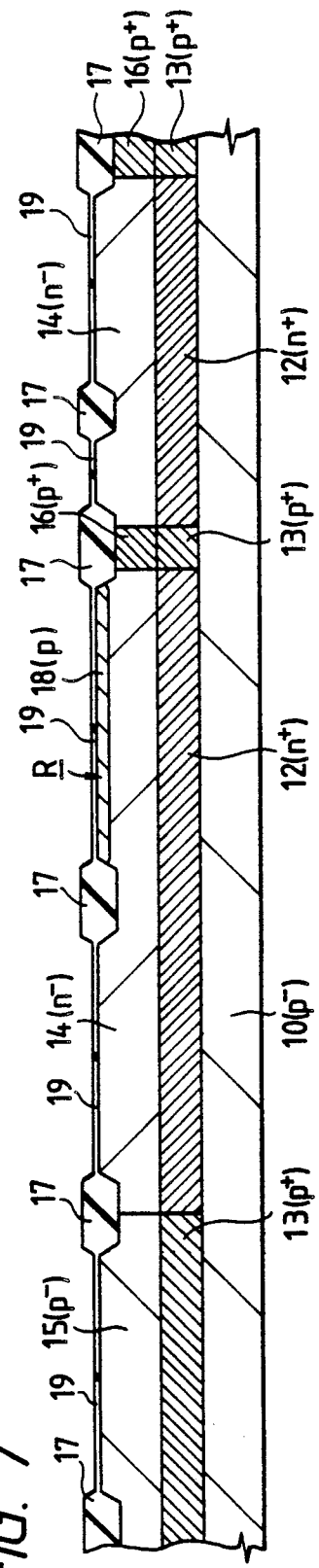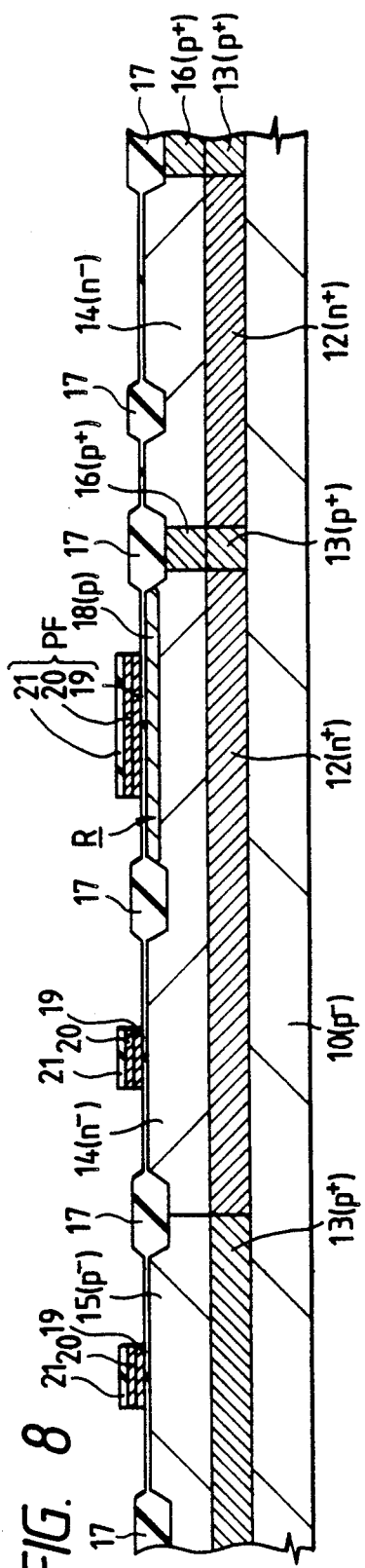

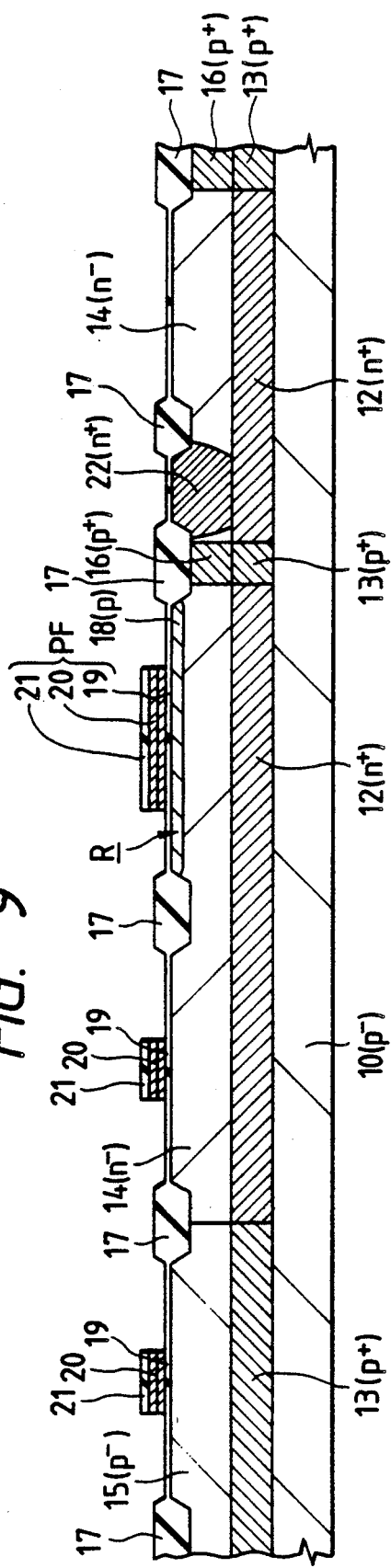
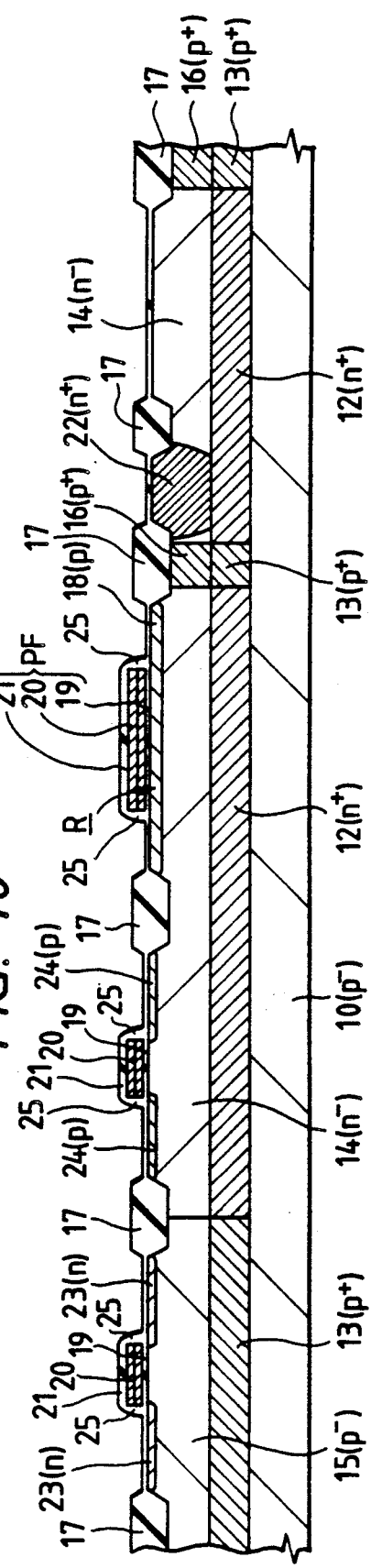

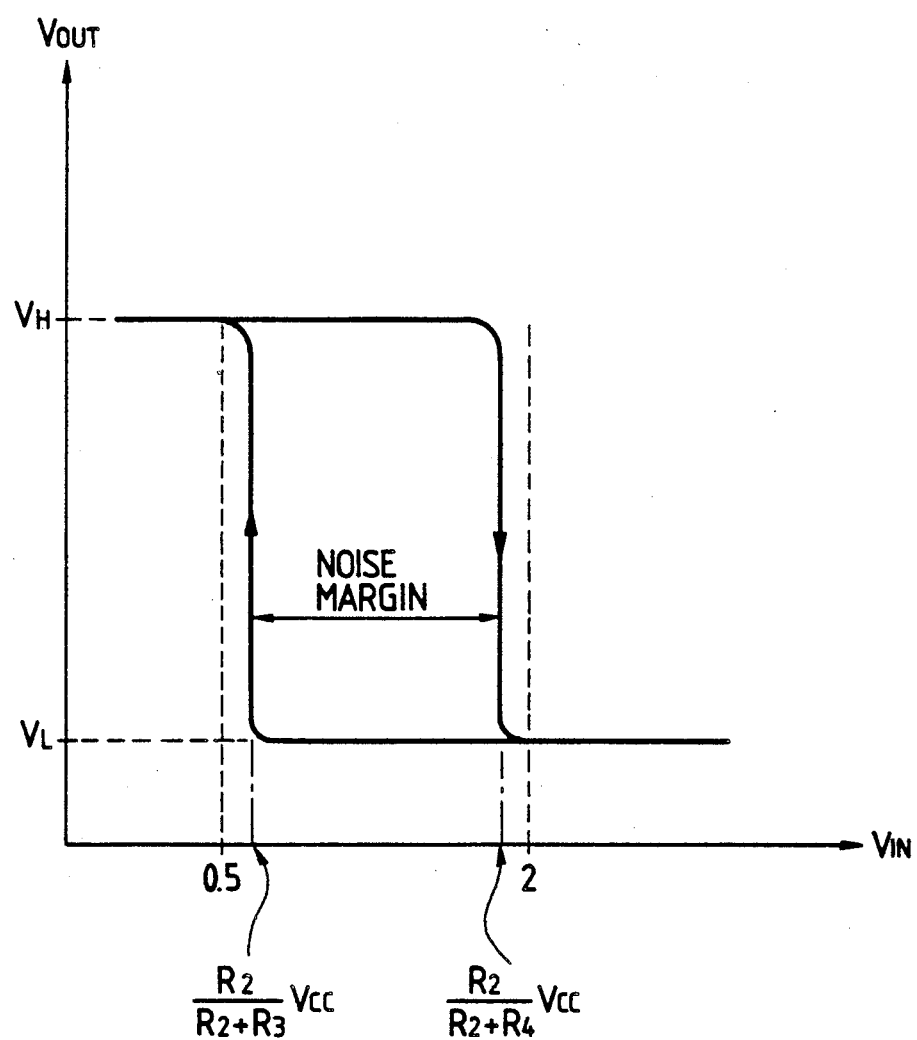

4,990,461

METHOD OF MAKING A SEMICONDUCTOR INTEGRATED CIRCUIT DEVICE HAVING RESISTANCE ELEMENTS

BACKGROUND OF THE INVENTION

This invention relates to a semiconductor integrated circuit device, and more particularly to a technique which will be useful when applied to a semiconductor integrated circuit device having a resistance element formed by a semiconductor region.

The inventor of the present invention has now been developing a semiconductor integrated circuit device employing a gate array system. The semiconductor integrated circuit device employing this gate array system can form predetermined logic circuits and memory circuits by a plurality of layers of wirings disposed inside, and between, basic cells. The semiconductor integrated circuit device employing the gate array system can form other kinds of logic circuits and memory circuits by merely changing the wiring patterns of the wirings of the plurality of layers described above. In other words, the gate array system has the characterizing feature in that a wide variety of semiconductor integrated circuit devices can be formed within a short period.

The semiconductor integrated circuit device employing the gate array system described above is a high performance hybrid semiconductor integrated circuit device including bipolar transistors and complementary MISFETs (CMOS) in mixture inside the same substrate. This hybrid semiconductor integrated circuit device is generally referred to as "Hi BiCMOS" (High performance Bipolar CMOS).

The bipolar transistor described above is of an npn type of a vertical structure consisting of an n-type emitter region, a p-type base region and an n-type collector region. The n-type collector region consists of an n-type epitaxial layer having a low impurity concentration, a buried type semiconductor region for reducing the collector resistance and a potential pick-up semiconductor region for picking up a collector current onto the surface of the substrate. The potential pick-up semiconductor region is formed by deeply diffusing thermally an n-type impurity from the surface of the substrate in order to bring its bottom surface into contact with the buried type semiconductor region. Each of these buried type semiconductor region and potential pick-up semiconductor region has a high impurity concentration. The p-type base region is formed on the main planar portion of the epitaxial layer and the n-type emitter region is formed on the main planar portion of the p-type base region.

Among the complementary MISFETs described above, the p-channel MISFET is composed of a channel formation region, a gate insulator film, a gate electrode, a p-type source region and a drain region. Similarly, the n-channel MISFET is composed of the channel formation region, the gate insulator film, the gate electrode, the n-type source region and the drain region.

Incidentally, the hybrid semiconductor integrated circuit device described above is disclosed, for example, in "Nikkei Electronics", Mar. 10, 1986, published by Nikkei-McGraw Hill Co., pp. 199~217, and the Bipolar-CMOS gate array, in "Nikkei Electronics", Aug. 12, 1985, pp. 187~195.

SUMMARY OF THE INVENTION

During the development of the hybrid semiconductor integrated device employing the afore-mentioned gate array system, the inventor of the present invention has found that the following problems are encountered.

Input/output buffer circuits are disposed at the peripheral portions of the hybrid semiconductor integrated circuit device employing the gate array system which is under development. Among the input/output buffer circuits, an input buffer circuit consists of a Schmit (or Schmit trigger) circuit in order to improve the noise margin of an input signal. This Schmit trigger circuit comprises primarily the combination of n-p-n bipolar transistors of a vertical structure with resistance elements.

The hybrid semiconductor integrated circuit device employing the gate array system which is now being developed by the present inventor is fabricated by a so-called "1.3 [μm] process" having a minimum manufacturing dimension of 1.3 [μm]. The hybrid semiconductor integrated circuit device employing this fabrication process uses an LDD (Lightly Doped Drain) structure for the complementary MISFETs, particularly for n-channel MISFETs. The channel formation side of at least the drain region having a high impurity concentration is formed by a low impurity concentration. The low impurity concentration drain region is formed by ion implantation of an n-type impurity using the gate electrode as a mask for introducing the impurity. The drain region having the high impurity concentration is formed likewise by ion implantation of the n-type impurity using the sidewall spacer, which is formed on the sidewalls of the gate electrode, as the mask for introducing the impurity. The sidewall spacer is formed by depositing a silicon dioxide film on the entire surface of the substrate including the gate electrode by CVD, applying then anisotropic etching such as RIE to the silicon dioxide film to the extent corresponding to the thickness of the deposited film and removing the silicon dioxide film at the flat portions.

The fabrication process of the hybrid semiconductor integrated circuit device employing the gate array system which is now under development is briefly as follows.

First of all, the buried semiconductor region as the n-type collector region of the bipolar transistor and the n-type epitaxial layer are formed.

Next, the gate-insulator film and gate electrode of the complementary MISFET are formed.

The potential pick-up semiconductor region of the n-type collector region of the bipolar transistor is formed subsequently. Since the potential pick-up semiconductor region is formed in a high impurity concentration and is diffused into a deep position from the surface of the substrate as described already, as the n-type collector region of the bipolar transistor and the n-type epitaxial layer are formed.

Next, the gate insulator film and gate electrode of the complementary MISFET are formed.

The potential pick-up semiconductor region of the n-type collector region of the bipolar transistor is formed subsequently. Since the potential pick-up semiconductor region is formed in a high impurity concentration and is diffused into a deep position from the surface of the substrate as described already, can be set with high accuracy. Particularly because the noise margin of- the input signal changes with the change of the resistance value of the resistance element in the Schmit trigger circuit of the input buffer circuit, the resistance value of the resistance element must be highly accurate. This resistance element is formed with a resistance value of from about 1 to about 35[KΩ/square], for example.

Next, the p-type base region of the bipolar transistor and the high impurity concentration source and drain regions of the complementary MISFET are formed sequentially The hybrid semiconductor integrated circuit device is substantially complete by forming then the n-type emitter region of the bipolar transistor.

Thereafter, logic circuits or memory circuits are formed by forming predetermined wiring patterns to complete the hybrid semiconductor integrated circuit device.

In the fabrication process of the hybrid semiconductor integrated circuit device described above, however, the insulator film (primarily, the silicon dioxide film) on the surface of the substrate is removed by over-etching at the formation step of the sidewall spacer forming the LDD structure and the surface of the substrate is exposed. Impurities and contaminants from the high impurity concentration semiconductor region and /or a diffusion furnace are introduced into the exposed surface of the substrate, particularly into the formation region of the resistance element. Accordingly, there occur the problems in that the resistance value of the resistance element fluctuates, the margin of the input signal of the Schmit trigger circuit of the input buffer circuit becomes small and erroneous operations occur frequently.

In the hybrid semiconductor integrated circuit device employing the 1.3[μm] fabrication process, the insulator film is formed on the semiconductor region as the resistance element. This insulator film is formed by the same fabrication step as that of the gate insulator film of the complementary MISFET The insulator film is formed in a small film thickness by the rule of proportional contraction and moreover, is over-etched at the time of machining of the gate electrode. Therefore, it is formed by an extremely small film thickness such as about 100 [Å]. The thickness of the insulator film is further reduced by the washing step in the fabrication process or its damage occurs due to the introduction of the impurity by ion implantation. Therefore, the n-type (e.g. phosphorus) impurity is diffused out during the long heat diffusion treatment for forming the potential pickup semiconductor region of the n-type collector region and is introduced into the formation region of the resistance element. Such a problem can be solved by separating sufficiently the diffusion source of the n-type impurity from the resistance element but no space for separating them sufficiently exists due to higher density integration. The n-type impurity thus introduced increases the resistance value of the resistance element to an extremely high level or inverses a conductivity type and causes the problem in that the erroneous operations occur frequently in the Schmit trigger circuit as described above.

In a semiconductor integrated circuit device having a resistance element by (or made of) a semiconductor region, it is an object of the present invention to provide a technique capable of reducing the change of the resistance value of the resistance element.

In a semiconductor integrated circuit device having MISFETs and resistance elements, it is another object of the present invention to provide a technique capable of reducing the change of the resistance values of the resistance elements and reducing the number of fabrication steps.

In a semiconductor integrated circuit device having MISFETs of an LDD structure and resistance elements, it is still another object of the present invention to provide a technique capable of reducing the change of the resistance value of the resistance element, reducing the number of fabrication steps and improving the integration density by reducing the occupying area by the resistance element.

The above and other objects and novel features of the present invention will become more apparent from the following description of the specification when taken in conjunction with the accompanying drawings.

Among the inventions disclosed herein, the following will illustrate the outline of a typical invention.

(1) In a semiconductor integrated circuit device having a resistance element formed by a semiconductor region, a protective layer made of a gate electrode material is disposed on the resistance element through an insulator film between them.

(2) In a semiconductor integrated circuit device having a resistance element formed by (or made of) a semiconductor region and MISFETs, a protective film made of the same layers as a gate insulator film and a gate electrode of the MISFET is disposed on the resistance element.

(3) The step (2) of forming the protective film is carried out in the same fabrication process as the step of forming the gate insulator film and gate electrode of the MISFET.

(4) The sidewall spacer is formed on the sidewalls of the protective film of the resistance element (2), a connection hole is formed in self-alignment on this sidewall spacer, an electrode extension semiconductor region for the resistance element is formed in self-alignment on the sidewall spacer and an extension electrode to be connected to the electrode extension semiconductor region through the connection hole is formed.

According to the means (1) or (2) described above, the introduction of the impurities and contaminants that may change the resistance value into the resistance element is reduced by the protective film. Accordingly, the fluctuation of the resistance value of the resistance element can be reduced.

According to the means (3) described above, the protective film can be formed on the resistance element at the step of forming the gate insulator film and gate electrode of the MISFET. Therefore, the number of fabrication steps of the semiconductor integrated circuit device can be reduced by the number corresponding to the formation step of the protective film.

According to the means (4) described above, the electrode extension semiconductor region of the resistance element and its extension electrode (connection hole) can be formed by self-alignment with respect to the sidewall spacer. Therefore, a margin for mask registration at the fabrication steps of both of them can be eliminated. As a result, the occupying area of the resistance element can be reduced by the area corresponding to the mask registration margin dimension and the integration density of the semiconductor integrated circuit device can be improved.

BRIEF DESCRIPTION OF THE DRAWINGS

FIGS. 6 to 12 are enlarged sectional views of principal portions showing step-wise the hybrid semiconductor integrated circuit device described above; and FIG. 13 is an operation characteristic diagram of a Schmit trigger circuit of the input buffer circuit described above.

DESCRIPTION OF THE PREFERRED EMBODIMENT

Figure 1:
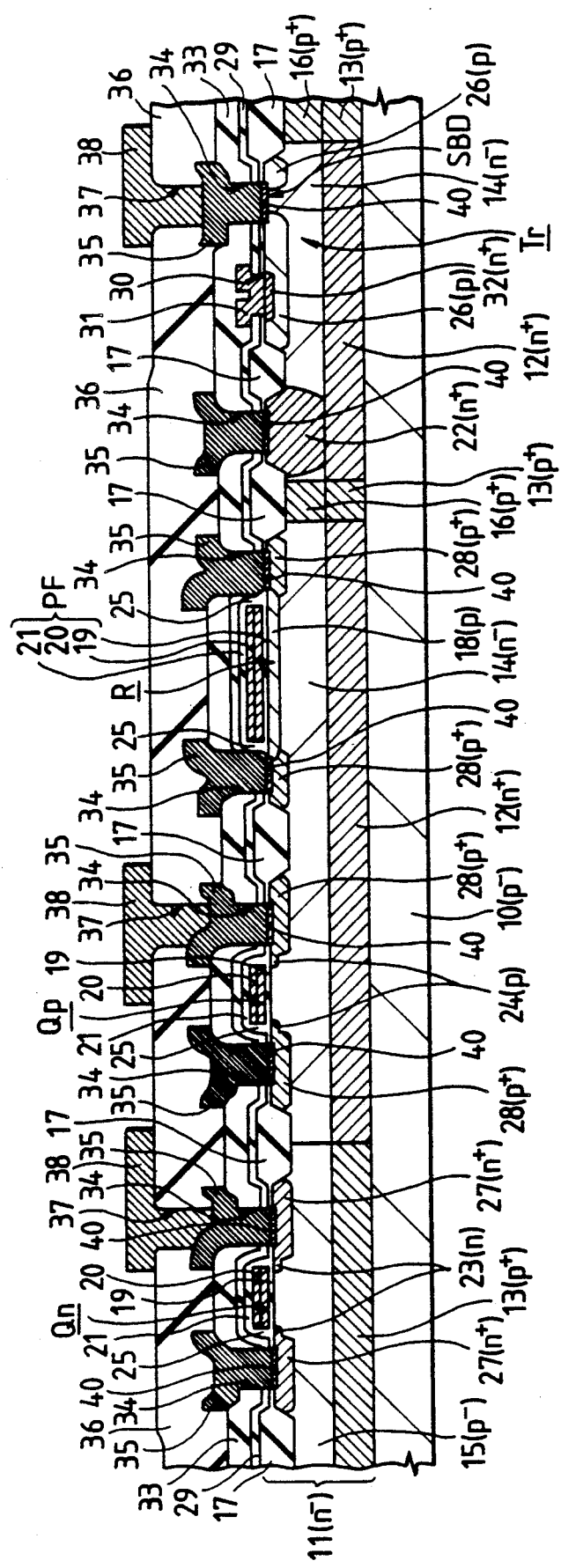
FIG. 1 is an enlarged sectional view of the principal portions of a hybrid semiconductor integrated circuit device employing the gate array system in accordance with one embodiment of the present invention.

Hereinafter, the construction of the present invention will be described with reference to one embodiment thereof applied to a hybrid semiconductor integrated circuit device (Hi BiCOMS) employing a gate array system.

Incidentally, like reference numerals will be used to identify those constituents which have the same function throughout the entire drawings, and repetition of explanation of such constituents will be omitted.

Figure 2:
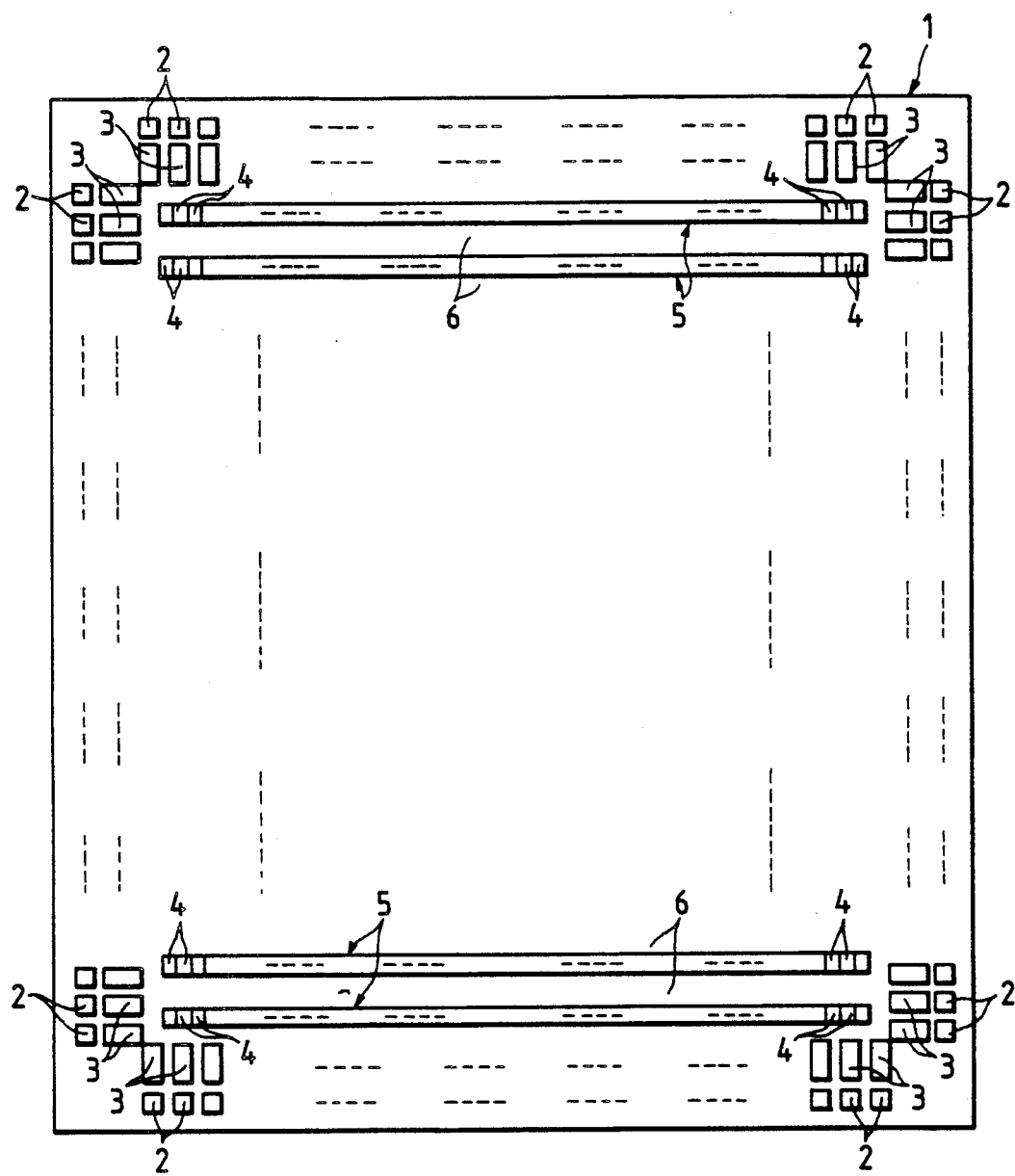
FIG. 2 is a chip layout view of the hybrid semiconductor integrated circuit device described above.

The basic schematic structure of the hybrid semiconductor integrated circuit device employing the gate array system in accordance with the present invention is shown in FIG. 2 (chip layout diagram).

As shown in FIG. 2, the hybrid semiconductor integrated circuit device 1 employing the gate array system is composed of a chip (e.g. a single crystal silicon substrate) having a rectangular flat surface. A plurality of external terminals (bonding pads) 2 are disposed at the outermost peripheral portion along each side of the rectangular hybrid semiconductor integrated circuit device 1. A plurality of input/output buffers 3 are disposed along the arrangement of the external terminals 2 inside them.

In the hybrid semiconductor integrated circuit device 1 of this embodiment, each logic circuit (or memory circuit) is composed by two layers of wirings for connection. The external terminals 2 are formed by the same fabrication step as that of the formation step of the second (or first) layer of wiring. The wiring consists of an aluminum wiring or an aluminum alloy wiring, for example. In the aluminum alloy wiring, Cu or Cu and Si are added to aluminum. Copper (Cu) functions to reduce electromigration or stress migration while silicon (Si) functions to reduce an alloy spike phenomenon at the connection portion between Si (semiconductor region) and the wiring.

As shown in FIG. 2, each input/output buffer circuit 3 is disposed at a position corresponding to one (or a plurality of) external terminal 2. The input/output buffer circuit 3 consists of cells for an input buffer circuit and cells for an output buffer circuit.

Figure 3:
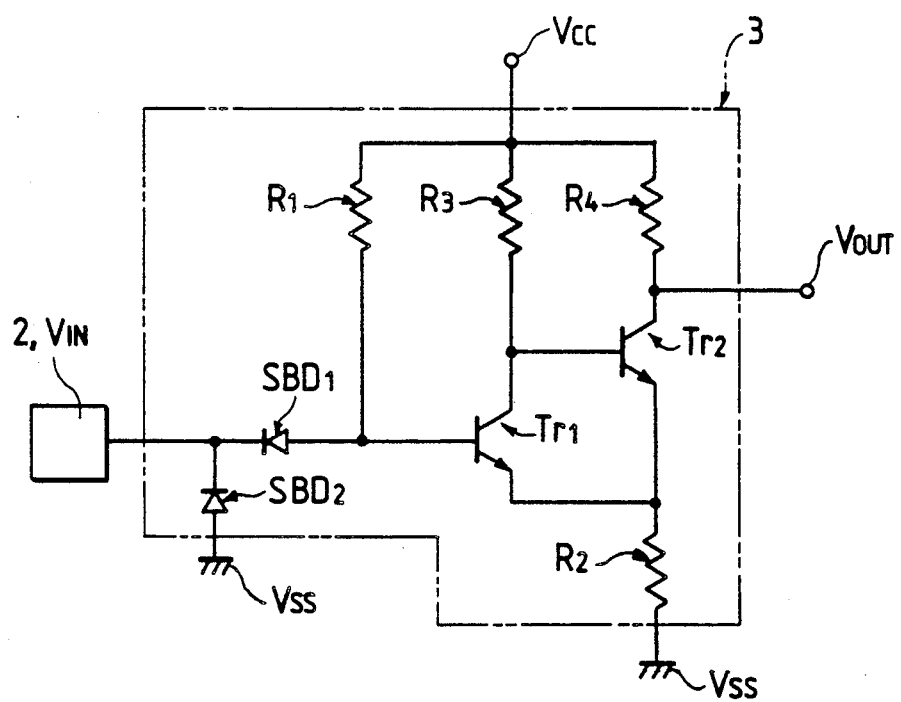
FIG. 3 is an equivalent circuit diagram of an input buffer circuit of the hybrid semiconductor integrated circuit device described above.

As shown in FIGS. 3 (equivalent circuit diagram) and 4 (enlarged plan view of principal portions), the cells for the input circuit of the input/output buffer circuit are arranged in such a manner as to constitute a Schmit trigger circuit. The Schmit trigger circuit 2 comprises primarily the combination of two n-p-n bipolar transistors Tr1, Tr2, four resistance elements R1, R2, R3, R4 and two Shottky barrier diodes SBD1, SBD2. Each of the bipolar transistors Tr1, Tr2 comprises an n-type collector region C, a p-type base region B and an n-type emitter region E. Symbol $V_{IN}$ represents the external terminal 2 for an input signal while symbol $V_{OUT}$ represents an output signal terminal for an internal logic circuit. Symbol $V_{CC}$ represents a power source voltage such as an operating voltage 5 [V] of the circuit and $V_{SS}$ does a reference voltage such as the ground potential 0 [V] of the circuit, for example.

The Schmit trigger circuit described above can set the noise margin of the input signal to a high value. The input/output operation characteristics of this Schmit trigger circuit are shown in FIG. 13 (operation characteristic diagram). As shown in FIG. 13, the Schmit trigger circuit is constituted in such a manner as to be capable of the inverter operation within a voltage range of the input signal $V_{IN}$ of from 0.5 to 2.0 [V] on the basis of standard rating. When the input signal $V_{IN}$ satisfies the following relational formula <1> in this Schmit trigger circuit, the output signal $V_{out}$ is kept at a high level $V_H$. When the input signal $V_{IN}$ satisfies the following relational formula <2> in this Schmit trigger circuit, the output signal $V_{out}$ is kept at a low level:

$$V_{IN} < \frac{R_2}{R_2 + R_4} V_{CC} \qquad <1>$$

$$V_{IN} > \frac{R_2}{R_2 + R_3} V_{CC} \qquad <2>$$

where $R_2$, $R_3$ and $R_4$ are resistance elements of the Schmit trigger circuit.

It is necessary for the Schmit trigger circuit to secure a large noise margin within the range of the input signal $V_{IN}$ and this noise margin varies with the ratio of the resistance elements $R_2 \sim R_4$ as shown in the relational formulas <1> and <2>.

Since the output stage of the Schmit trigger circuit comprises the bipolar transistor Tr2, driving capacity of the next stage circuit can be improved. Since the resistance elements $R_2 \sim R_4$ are set to the high resistance values in the Schmit trigger circuit, power consumption can be reduced.

Figure 4:
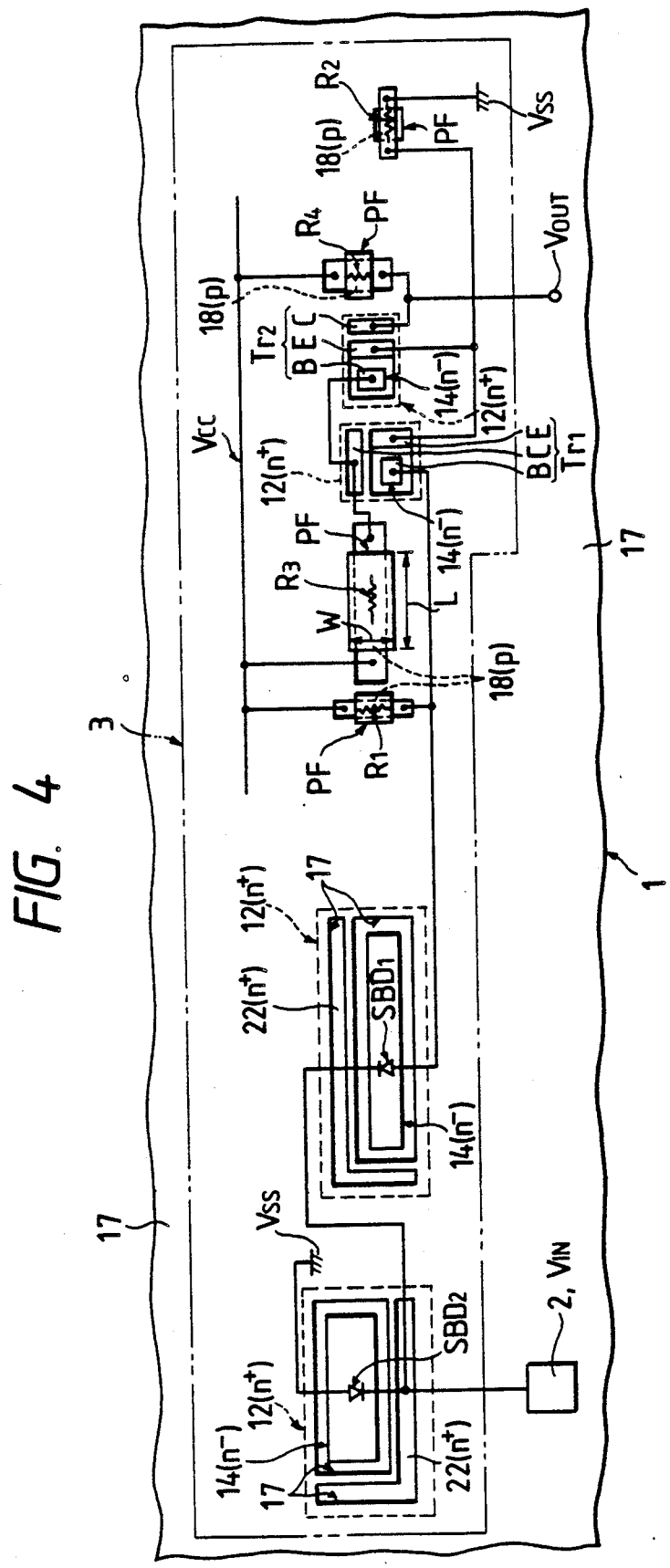
FIG. 4 is an enlarged plan view showing a definite structure of the input buffer circuit described above.

In the cell for the input buffer circuit, when the semiconductor elements are connected to one another by the wiring which is formed by the wiring formation step, the input buffer circuit can form the Schmit trigger circuit described above, for example. In FIG. 4, the wiring for connecting the semiconductor devices is represented briefly by solid line.

Though the definite construction of the cell for the output buffer circuit of the input/output buffer circuit 3 is not described, it comprises bipolar transistors or bipolar transistors and complementary MISFETs in the same way as the cell for the input buffer circuit. The cell for the output buffer circuit can constitute the output buffer circuit by connecting the semiconductor devices by the wiring formed by the wiring formation step in the same way as the cell for the input buffer circuit described above.

Connection of the semiconductor devices of the cells for the input and output buffer circuits is made primarily by the wiring 35 which is formed by the formation step of the first layer wiring. In other words, the input/output buffer circuit 3 is formed in the input buffer circuit or in the output buffer circuit by the wiring which is formed by the formation step of the first layer wiring.

Though not shown in the drawing, a main power source wiring extends on the input/output buffer circuit 3. This main power source wiring comprises the wiring 38 that is formed by the formation step of the second layer wiring. The main power source wiring comprises a power source voltage wiring $V_{cc}$ and a reference voltage wiring $V_{ss}$ that extend in the same direction.

The center portion of the semiconductor integrated circuit device 1 encompassed by a plurality of input-/output buffer circuits 3 is a logic circuit portion where a logic circuit is to be formed A plurality of basic cells 4 are arranged regularly in matrix in this logic circuit portion as shown in FIG. 2. The plurality of basic cells 4 disposed in the column direction constitute basic cell lines 5. A plurality of these basic cell lines 5 are disposed in the row direction with predetermined gap between them. The gaps between the basic cell lines 5 disposed in the row direction are used as wiring formation regions (wiring channel regions) 6 where a connecting wirings for connecting the basic cell lines 5 or for connecting mutually the basic cells 4 (or logic circuits) are formed.

Figure 5:
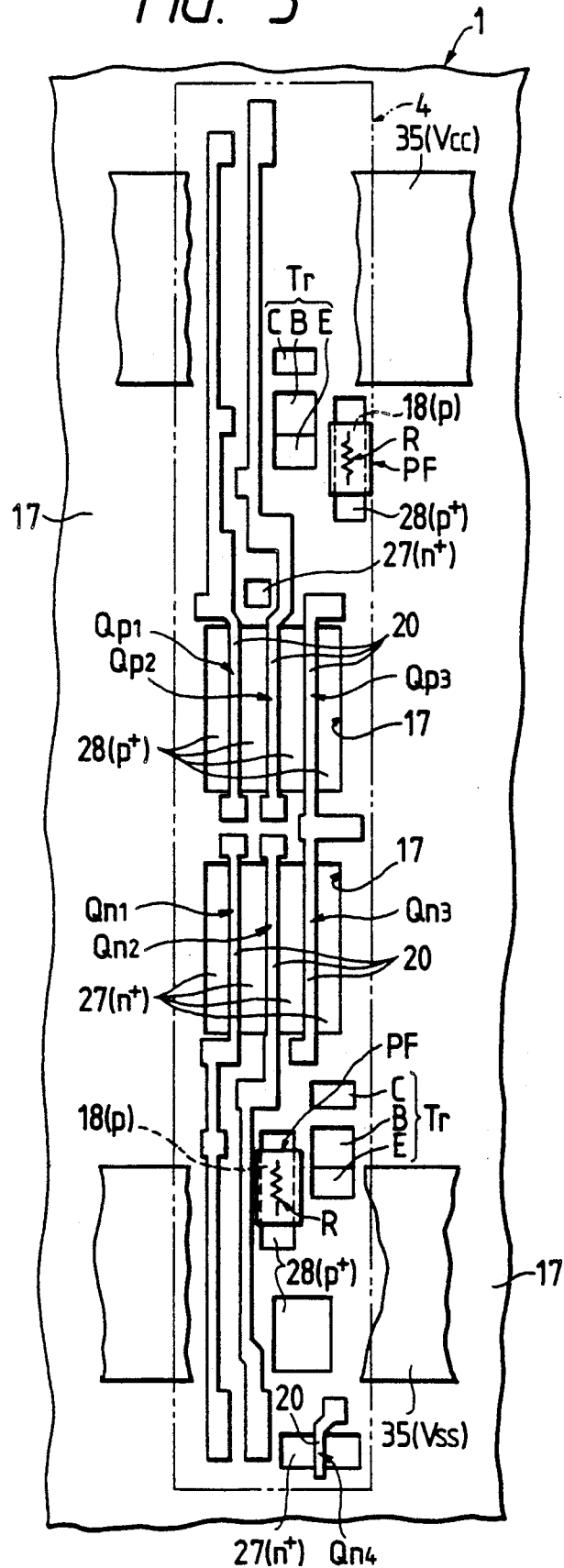
FIG. 5 is a plan view of the principal portions of a basic cell of the hybrid semiconductor integrated circuit device described above.

As shown in FIG. 5 (plan view of the principal portions), the basic cell 4 comprises three complementary MISFETs (CMOSs), one n-channel MSIFET $Qn_4$, two n-p-n bipolar transistors Tr and two resistance elements R. The complementary MISFET comprises three p-channel MISFETs $Qp_1 \sim Qp_3$ and three n-channel MIS-FETs $Qn_1 \sim Qn_3$. The detailed sectional structures of these semiconductor devices will be described later.

One of the semiconductor regions (28) of each of the three p-channel MISFETs $Qp_1 \sim Qp_3$ of the basic cell 4 adjacent to one another in the direction of length of the gate is formed integrally with one another and is corrected in series. Similarly, one of the semiconductor regions (27) of each of the three n-channel MISFETs $Qn_1 \sim Qn_3$ adjacent to one another in the direction of the gate length is formed integrally with one another and is connected in series. In other words, this basic cell 4 is constructed in such a manner as to be capable of forming a three-input NAND gate circuit. Incidentally, the basic cell 4 may be constructed in such a manner as to be capable of forming a two-input NAND gate circuit or a four-input NAND gate circuit besides the three-input NAND circuit described above.

Each bipolar transistor Tr disposed inside the basic cell 4 comprises an n-type collector region C, a p-type base region B and an n-type emitter region E and is an n-p-n vertical type.

Each of the complementary MISFETs, the bipolar transistors and the resistance elements R is connected by the connecting wiring 35 that is formed at the formation step of the first layer wiring (wiring inside the basic cell). This wiring inside the basic cell 4 constitutes a predetermined logic circuit or its part. A power source voltage wiring 35 $V_{cc}$ and a reference voltage wiring 35 $V_{ss}$ extend in the columnar direction on the basic cell 4 as shown in FIG. 5. These wirings $V_{cc}$ and $V_{ss}$ are formed at the formation step of the first layer wiring. The power source voltage wiring $V_{cc}$ extends onto or near the p-channel MISFET Qp, and the reference voltage wiring $V_{ss}$ extends onto or near the n-channel MISFET Qn. This power source voltage wiring $V_{cc}$ is connected either directly or indirectly through an auxiliary power source wiring, not shown, to a power source voltage wiring $V_{cc}$ of the main power source wiring that extends on the input/output buffer circuit 3. Similarly, the reference voltage wiring $V_{ss}$ is connected either directly or indirectly to the reference voltage wiring $V_{ss}$ of the main power source wiring described already.

Wirings for connecting primarily the basic cells 4 or the logic circuits formed by the basic cells are formed in the wiring formation regions 6 between the basic cell columns 5 shown in FIG. 2. In the wiring formation region are formed a connecting wiring 35 that is formed at the formation step of the first layer wiring and extends in the columnar direction and a connecting wiring 38 that is formed at the formation step of the second layer wiring and extends in the row direction.

The connecting wirings 35, 38 formed by the formation steps of the first and second layer wirings are arranged automatically by an automatic arrangement wiring system (Desin Automation) using a computer. Those connecting wirings which cannot be arranged by this DA system are arranged manually.

Next, the definite structure of the hybrid semiconductor integrated circuit device 1 employing the gate array system will be explained briefly with reference to FIG. 1 (an enlarged sectional view of the principal portions). FIG. 1 shows the principal semiconductor devices formed in the hybrid semiconductor integrated circuit device 1. The drawing shows the n-channel MISFET Qn, the p-channel MISFET Qn, the resistance element R, the bipolar transistor Tr and the Shottky barrier diode SBD from the right to the left in order named.

The hybrid semiconductor integrated circuit device 1 composed of a $p^-$-type semiconductor substrate 10 made of single crystal silicon An $n^-$-type epitaxial layer 11 is deposited onto the main plane of this semiconductor substrate 10.

The n-channel MISFET Qn is formed on the main plane of a $p^-$-type well region 15 inside the region which is encompassed by a device isolation insulator film (a field oxidation film) 17. The isolation insulator film 17 comprises a silicon dioxide film which is in turn formed by selectively oxidizing the main plane of the $p^-$-type well region An buried $p^+$-type semiconductor region 13 is disposed at the bottom portion of the $p^-$-well region 15. This buried $p^+$-type semiconductor region 13 is disposed between the semiconductor substrate 10 and the epitaxial layer 11.

The n-channel MISFET Qn comprises the $p^-$-type well region (channel formation region) 15, the gate insulator film 19, the gate electrode 20 and the pair each of n- and $n^+$-type semiconductor regions 23 and 27 that are used as the source and drain regions, respectively.

The gate insulator film 10 comprises a silicon dioxide film, for example, which is formed by oxidizing the main plane of the $p^-$-type well region 15 and is from about 20 to about 30 [nm] thick.

The gate electrode 20 consists, for example, of a composite film formed by superposing a refractory metal silicide film (e.g. $WSi_2$) on a polycrystalline silicon film. The polycrystalline silicon film is deposited by CVD, for example, and an n-type impurity for reducing the resistance value is introduced. This polycrystalline silicon film is from about 200 to about 300 [nm] thick, for example. The refractory metal silicide film is deposited by spattering, for example, and is from about 250 to about 350 [nm] thick. The gate electrode 20 is not particularly limited to the gate electrode material described above but may be formed by a polycrystalline silicon film, a refractory metal silicide film or a single layer of the refractory metal silicide film or their composite film (other than the composite film described above).

The n-type semiconductor region 23 of the low impurity concentration is formed integrally with the n+-type semiconductor region 27 of the high impurity concentration and is disposed on the channel formation region side. The n-type semiconductor region 23 constitutes an n-channel MISFET Qn having an LDD structure. The n-type semiconductor region 23 is formed by self-alignment with respect to the gate electrode 20. The n+-type semiconductor region 27 is formed in self-alignment with respect to the sidewall spacer 25 which is in turn formed in self-alignment to the sidewall of the gate electrode 20. The sidewall spacer 25 is formed by depositing a silicon dioxide film, for example, on the entire surface of the substrate inclusive of the portion on the gate electrode 20 by CVD, for example, and removing the flat portion of the silicon dioxide film by the thickness corresponding to the deposited film thickness of the silicon dioxide film by anisotropic etching such as RIE.

The connecting wiring 35 is connected to the n+-type semiconductor region 27 which is the source and drain regions of the n-channel MISFET Qn through the connection hole 34 formed in inter-level insulator films 29 and 33. This connecting wiring 35 is formed by the wiring formation step of the first layer as described already. Another connecting wiring 38 is connected to a predetermined connecting wiring 35 through a connection hole 37 bored on an inter-level insulator film 36. A connecting wiring 38 is formed by the wiring formation step of the second layer.

The p-channel MISFET Qp is formed in the main plane of the n−-type well region 14 in the region encompassed by the device isolation insulator film 17. The buried n+-type semiconductor region 12 is formed at the bottom portion of this n−-type well region 14. The buried n+-type semiconductor region 12 is disposed between the semiconductor substrate 10 and the epitaxial layer 11.

The p-channel MISFET Qp comprises the n−-type well region (the channel formation region) 14, the gate insulator film 19, the gate electrode 20 and a pair each of p-type semiconductor regions 24 and p+-type semiconductor regions 28 used as the source and drain regions, respectively. The p-channel MISFET Qp has the LDD structure (or may not have the LDD structure) in the same way as the n-channel MISFET Qn.

An alloy layer 40 is disposed inside the connection hole 34 between the n+-type semiconductor region and the connecting wiring 35 and between the p+-type semiconductor region 28 and the connecting wiring 35. This alloy layer 40 comprises for example, of a ternary system of platinum, aluminum and silicon ($PtAl_xSi_y$). As will be described later, this alloy layer 40 is formed by the same fabrication step of the anode region of the shottky barrier diode device SBD.

The bipolar transistor Tr is formed on the main plane of the semiconductor substrate 10 inside the region encompassed by a device isolation region. The device isolation region comprises the semiconductor substrate 10, the buried p+-type semiconductor region 16 and the isolation insulator film 17. The p+-type semiconductor region 16 for the device isolation is formed on the main plane portion of the epitaxial layer 11 sandwiched between the buried p+-type semiconductor region 13 and the isolation insulator film 17.

The bipolar transistor Tr comprises primarily the n-type collector region, the p-type base region and the n-type emitter region In other words, the bipolar transistor is composed of a vertical n-p-n type.

The n-type collector region comprises the n−-type well region 14 (or the epitaxial layer 11), the buried n+-type semiconductor region 12 and the n+-type semiconductor region 22 for picking up the collector potential. The buried n+-type semiconductor region 12 is disposed substantially on the entire zone of the bipolar transistor in such a manner as to reduce the collector resistance. The n+-type semiconductor region 22 for picking up the collector potential is formed in such a manner that is bottom comes into contact with the buried n+-type semiconductor region and this region 22 picks up the collector current to the surface of the n−-type well region 14.

The connecting wiring 35 is connected to the n+-semiconductor region 22 for picking up the collector potential, of the n-type collector region. The connecting wiring 35 is formed by the wiring formation step of the first layer.

The p-type base region comprises a p-type semiconductor region 26 that is disposed on the main plane portion of the n−-type well region 14. The connecting wiring 35 is connected to the p-type semiconductor region 26 as the p-type base region.

The n-type emitter region comprises an n+-type semiconductor region 32 that is disposed on the main plane portion of the p-type semiconductor region 26 as the p-type base region. The n+-type region 32 is formed by drive-in diffusing an n-type impurity, introduced into the emitter pick-up electrode 31 connected thereto, into the main plane portion of the p-type semiconductor region 26. The emitter pick-up electrode 31 comprises a polycrystalline silicon film into which an n-type impurity is doped. The emitter pick-up electrode 31 is connected to the n+-type semiconductor region 32 through an emitter opening 30 bored the inter-level insulator film 29. In other words, the n+-type semiconductor region 32 is formed in self-alignment with respect to the emitter pick-up electrode 31.

As shown on the right side of FIG. 1, the Shottky barrier diode device SBD uses the aforementioned alloy layer 40 as its anode region and the n−-type well region 14 as the cathode region. This Shottky barrier diode device SBD is interposed primarily between the base and collector of each bipolar transistor $Tr_1$, $Tr_2$ of the Schmit trigger circuit shown in FIGS. 3 and 4. This Shottky barrier diode device SBD has substantially the same structure as that of each Shottky barrier diode device $SBD_1$, $SBD_2$ inserted into the pre-stage of the Schmit trigger circuit described above.

The resistance element R, particularly, the resistance elements $R_1$–$R_4$ in the Schmit trigger circuit shown in FIGS. 3 and 4, are formed on the main plane of the n−-type well region 14 inside the region encompassed by the device isolation insulator film 17 as shown in FIG. 1. Each of these resistance elements $R_1$–$R_4$ comprises primarily the p-type semiconductor region 18.

The p-type semiconductor region 18 of each of these resistance elements $R_1$–$R_4$ is disposed on the main plane portion of the n−-type well region 14 The p-type semiconductor region 18 is constituted in such a manner as to define a substantial resistance value of each resistance element $R_{1-R4}$. In the case of the hybrid semiconductor integrated circuit device 1 employing the 1.3 [μm] fabrication process, for example, the p-type semiconductor region 18 is formed in such a manner as to be possessed of a resistance value of about 10 [kΩ/square]. Among the resistance elements $R_1$-$R_4$, the p-type semiconductor region 18 as the majority of the resistance elements $R_1$-$R_3$ has a greater resistor length L (the dimension between the electrode extension p+-type semiconductor regions 28) than a resistor width W (i.e. L>W). In other words, since the p-type semiconductor region 18 is not used as the source and drain regions of the MISFET but is used as the resistance elements $R_1$-$R_4$. For this reason, the resistor length L is greater than the resistor width W as described above. The following Table 1 illustrates the typical resistance values and sizes of the resistance elements $R_1$-$R_4$ used for the Schmit trigger circuit described above.

TABLE 1

| resistance element | $R_1$ | $R_2$ | $R_3$ | $R_4$ |
|---|---|---|---|---|
| resistance value [kΩ] | 20 | 2 | 31.3 | 6.9 |
| size, W/L [μm] | 5/9.5 | 5/7 | 10/21.9 | 9.9/6.9 |

*W: resistor width
L: resistor length

A protective film PF is disposed on the p-type semiconductor region 18 of the resistance elements $R_1$-$R_4$. The protective film PF cuts off any impurities or contaminants and prevents them from being introduced into, and collected by, the p-type semiconductor region 18. The impurities include those which are diffused out from the semiconductor region of the high impurity concentration during the fabrication process of the hybrid semiconductor integrated circuit device 1 and those which adhere to the diffusion furnace used for the fabrication process. In the Schmit trigger circuit, in particular, the collector potential pick-up n+-type semiconductor region 22 of the bipolar transistor having a high impurity concentration is disposed around the resistance elements $R_1$-$R_4$ as shown in FIG. 4. These resistance elements $R_1$-$R_4$ and semiconductor region having the high impurity concentration are disposed close to one another because there is no layout margin due to the high integration density. Accordingly, the resistance values of the resistance elements $R_1$-$R_4$ fluctuate due to the impurities diffused out from the semiconductor region of the high impurity concentration disposed adjacent thereto. The fluctuation of about one digit occurs easily in the resistance elements $R_1$-$R_4$ when the impurity diffused out from the semiconductor region having the high impurity concentration are introduced into them. The contaminants described above include those which adhere to the diffusion furnace used for the fabrication process.

The protective film PF is composed of a composite film obtained by laminating sequentially the insulator film 19, a conductor layer (the gate electrode material) and the insulator film 21. Each of the insulator film 19, the conductor layer 20 and the insulator film 21 of this protective film PF is formed by the same layer as the gate insulator film 19, gate electrode 20 and insulator film 21 of the p-channel MISFET Qp or n-channel MISFET Qn. The conductor layer 20 is constituted in such a manner as to cut off substantially any impurities and contaminants The insulator film 19 of the protective film PF is constituted in such a manner as to cut off any impurities and contaminants and to isolate between the conductor layer 20 and the p-type semiconductor region 18 lest the conductor layer 20 causes the fluctuation of the resistance value of the resistance element R. The insulator film 21 of the protective film PF is constituted in such a manner as to cut off any impurities and contaminants and to electrically isolate the conductor layer 20 of the protective film PF from the extension electrode 35.

This conductor layer 20 of the protective film PF is formed in the electrically floating state. The protective film PF may be connected to the power source voltage $V_{cc}$ and to the fixed potential of the reference voltage $V_{ss}$, though the circuit structure gets somewhat complicated.

The p+-type electrode extension semiconductor region 28 is disposed at at least one of the ends of each resistance element $R_1$-$R_r$ in its longitudinal direction L. This region 28 is disposed on the main plane portion of the n−-type well region 14. The electrode extension p+-type semiconductor region 28 is of the same conductivity type as that of the p-type semiconductor region 18, is formed integrally with it (or electrically connected thereto) and has a higher impurity concentration than the p-type semiconductor region 18 The electrode extension p+-type semiconductor region 28 having the high impurity concentration can improve the ohmic contact characteristics when connected to the extension electrode 35.

The electrode extension p+-type semiconductor region 28 is formed by self-alignment with respect to the sidewall spacer 25 formed on the sidewall of the protective film PF. This sidewall spacer 25 is formed by the same layer (by the same fabrication step) as that of the sidewall spacer 25 disposed on the sidewall of each gate electrode 20 of the complementary MISFET, and is formed by self-alignment with respect to the protective film PF.

The extension electrode 35 (at the formation step of the first layer wiring) is connected to the electrode extension p+-type semiconductor region 28 through the connection hole 34 formed in the inter-level insulator films 29 and 33. The lower part of the connection hole 34 connecting the electrode extension p+-type semiconductor region 28 to the extension electrode 35 is encompassed by the sidewall spacer 25 and the device isolation insulator film 17 and defines a substantial open dimension. The open dimension at the upper part of the connection hole 34 is greater than that at the lower part at least by a size corresponding to the mask registration margin in the fabrication process In other words, the substantial open dimension of the connection hole 34 is defined by the sidewall spacer 25 and the device isolation insulator film 17 and particularly the position of the connection hole 34 on the protective film PF side is limited by the sidewall spacer 25. Accordingly, it is formed by self-alignment with respect to this sidewall spacer 25. In other words, the mask registration margin during the fabrication process is eliminated between the electrode extension p+-type semiconductor region 28 of the resistance element R and the connection hole 34, through which the extension electrode 35 is passed, on the protective film PF side.

In the hybrid semiconductor integrated circuit device 1 employing the gate array system such as described above, the protective film PF comprising the insulator film 19 and the conductor layer 20 (or/and the insulator film 21) is disposed on the resistance element R (particularly, $R_1$-$R_4$) formed by the p-type semiconductor region 18. According to this structure, the introduction of any impurities and contaminants, that may fluctuate the resistance value, into the resistance element R is prevented by the protective film PF so that the fluctuation of the resistance value of the resistance element R can be reduced. As a result, the Schmit trigger circuit as the input buffer circuit of the input/output circuit 3, in particular, can improve controllability of the resistance elements $R_1-R_4$ and hence, the input signal margin can be improved. Incidentally, the protective film PF is likewise disposed on the p-type semiconductor region 18 in the same way as the resistance elements $R_1-R_4$ of the Schmit trigger circuit for the resistance element R disposed inside the basic cell 4 shown in FIG. 5. The protective film PF need not be disposed for the resistance element R inside this basic cell 4 because there is no serious problem for the operation of the logic circuit even when some fluctuation of the resistance values occurs when compared with the Schmit trigger circuit.

Next, the definite fabrication process of the hybrid semiconductor integrated circuit device 1 employing the gate array system will be explained briefly with reference to FIGS. 6 to 12 (each being an enlarged sectional view showing the principal portions at each fabrication step).

First of all, a $p^-$-type semiconductor substrate 10 made of single crystal silicon is prepared.

Next, an n-type impurity is introduced into the formation region of each of the bipolar transistors, the p-channel MISFETs Qp and the resistance elements R. A p-type impurity is then introduced into the main plane portion of the semiconductor substrate 10 at the formation region of each of the n-channel MISFETs Qn and the isolation region.

An $n^-$-type epitaxial layer 11 is grown on the main plane of the semiconductor substrate 10. Due to the growth of this epitaxial layer 11, the n-type and p-type impurities introduced into the main plane portion of the semiconductor substrate 10 are diffused, forming thereby the buried $n^+$-type semiconductor region 12 and the buried $p^-$-type semiconductor region 13, respectively.

Next, an n-type impurity is introduced into the main plane portion of the epitaxial layer 11 at the formation region of each of the bipolar transistors Tr, the p-channel MISFETs Qp and the resistance elements R to form the $n^-$-type well region 14. Thereafter, a p-type impurity is introduced into the main plane portion of the epitaxial layer 11 at the formation region of the n-channel MISFETs Qn to form the $p^-$-type well region 15. Thereafter, a p-type impurity is introduced into the main plane portion of the epitaxial layer 11 to form a $p^-$-type semiconductor region 16 for the device isolation.

Next, as shown in FIG. 6, the device isolation insulator film 17 is formed on the main plane of each of the $n^-$-type well region 14, the $p^-$-type well region 15 and the $p^-$-type semiconductor region 16 in the formation region of the device isolation region.

A p-type semiconductor region 18 is then formed on the main plane portion of the epitaxial layer 11 in the formation region of the resistance element R as shown in FIG. 7. This p-type semiconductor region 18 is formed as the resistance element R, particularly as the resistance elements $R_1-R_4$ comprising the Schmit trigger circuit of the input buffer circuit of the input/output buffer circuit 3. The p-type semiconductor region 18 can be formed, for example, by the ion implantation of B or $BF_2$ in a dose of about $10^{12}-10^{13}$ [atoms/cm$^2$]. The p-type semiconductor region 18 determines the substantial resistance value of the resistance element R. Since this region 18 cannot be formed after the protective film PF (the gate electrode 20) is formed thereon, it is formed before the formation step of the protective film PF.

Next, the gate insulator film 19 is formed at least on the main plane of the $p^-$-type well region 15, which is the formation region of the n-channel MISFET Qn, on the main plane of the $n^-$-well region 14 which is the formation of the p-channel MISFET Qp. The gate insulator film 19 is formed in the same thickness as the film thickness by the afore-mentioned formation method. The insulator film 19 which is part of the protective film PF is formed on the main plane of the p-type semiconductor region 18 as the formation region of the resistance element R by the same fabrication step as that of the gate insulator film 19. Incidentally, the p-type semiconductor region 18 may be formed by the ion implantation of B or $BF_2$ through the insulator film 19 after this film 19 is formed.

Next, as shown in FIG. 8, the gate electrode 20 and the insulator film 21 are formed at the upper part of the gate insulator film 19 and the conductor layer 21 and the insulator film 21 are formed at the upper part of the insulator film 19 as the formation region of the resistance element R. The substantial protective film PF is complete when each of the insulator film 19, the conductor layer 21 and the insulator film 21 is formed.

Each of the gate electrode 20 and the insulator film 21 is machined by anisotropic etching and originally, the insulator film 19 at the upper part of the p-type semiconductor region 18 of the resistance element R should be over-etched. Since the conductor layer 20 and the insulator film 21 are disposed at the upper part of the p-type semiconductor region 18, however, the insulator film 19 at the upper part of the p-type semiconductor region 18 is not over-etched in the same way as the gate insulator film 19. In other words, the insulator film 19 having the same film thickness as that of the gate insulator film 19 is always formed at the upper part of the p-type semiconductor region 18 and the surface of the p-type semiconductor region 18 is not exposed.

Next, as shown in FIG. 9, the collector potential pick-up $n^+$-type semiconductor region 22 is formed on the main plane of the epitaxial layer 11 in the formation region of the bipolar transistor Tr. This $n^+$-type semiconductor region 22 is formed by, for example, the ion implantation of P (phosphorus) in a does of about $10^{16}$ [atoms/cm$^2$]. As described already, the collector potential pick-up $n^+$-type semiconductor region 22 has a high impurity concentration and is moreover formed. Through thermal diffusion treatment for a long period so that its bottom surface is in contact with the buried $n^+$-type semiconductor region 21.

Since the protective film PF is disposed on the p-type semiconductor region 18 of the resistance element R, phosphorus (P) for forming the collector potential pick-up semiconductor region 22, which is diffused out is not introduced into this semiconductor region 18. This also holds true of the impurities and contaminants that adhere to the diffusion furnace.

Next, in the formation region of the n-channel MISFET Qn, the n-type semiconductor region 23 is formed on the main plane of the $p^-$-type well region 15. This n-type semiconductor region 23 constitutes the LDD structure, and is formed by the ion implantation of P(phosphorus) in a does of about $10^{13}$ [atoms/cm$^2$], for example. The n-type semiconductor region 23 is formed in self-alignment with respect to the gate electrode 20.

In the formation region of the p-channel MISFET Qp, the p-type semiconductor region 24 is formed on the main plane of the n-type well region 14. This p-type semiconductor region 24 constitutes the LDD structure, and is formed by the ion implantation of B in a dose of about $10^{13}$ [atoms/cm$^2$], for example The p-type semiconductor region 24 is formed in self-alignment with the gate electrode 20.

These n- and p-type semiconductor regions 23 and 24 are formed after the formation step of the collector potential pick-up n$^+$-type semiconductor 22. In other words, the diffusion depth of these n-type and p-type semiconductor regions 23 and 24 can be reduced. This also holds true of the n$^+$-type semiconductor region 27 and p$^-$-type semiconductor region 28 that are formed subsequently and are used as the source and drain regions having a high impurity concentration, respectively.

Next, as shown in FIG. 10, the sidewall spacer 25 is formed on the sidewalls of the gate electrode 20 and the sidewalls of the conductor layer 20 of the protective film PF. This sidewall spacer 25 is formed by depositing a silicon dioxide film by CVD and then applying anisotropic etching thereto.

Next, in the formation region of the bipolar transistor Tr, the p-type semiconductor region 26 is formed on the main plane of the n$^-$-type well region. This p-type semiconductor region 26 is used as the p-type base region, and is used by the ion implantation of B(Boron) in a does of about $10^{14}$ [atoms/cm$^2$], for example In the formation region of the n-channel MISFET Qn, the n$^+$-type semiconductor region 27 is formed on the main plane of the p$^-$-type well region 15. This n$^+$-semiconductor region 27 is used as the source and drain regions. The n$^+$-type semiconductor region 27 is formed by the ion implantation of As in a dose of about $10^{16}$ [atoms/cm$^2$], for example, and in self-alignment with the sidewall spacer 25. After this n$^+$-type semiconductor region 27 is formed, the n-channel MISFET Qn is complete.

Figure 11:
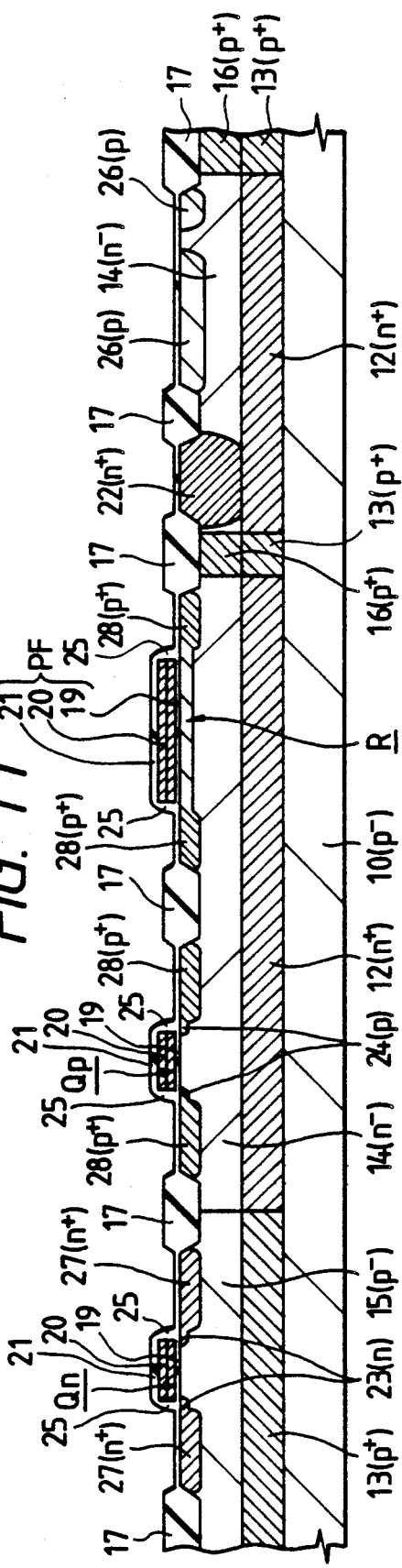
Figure 12:
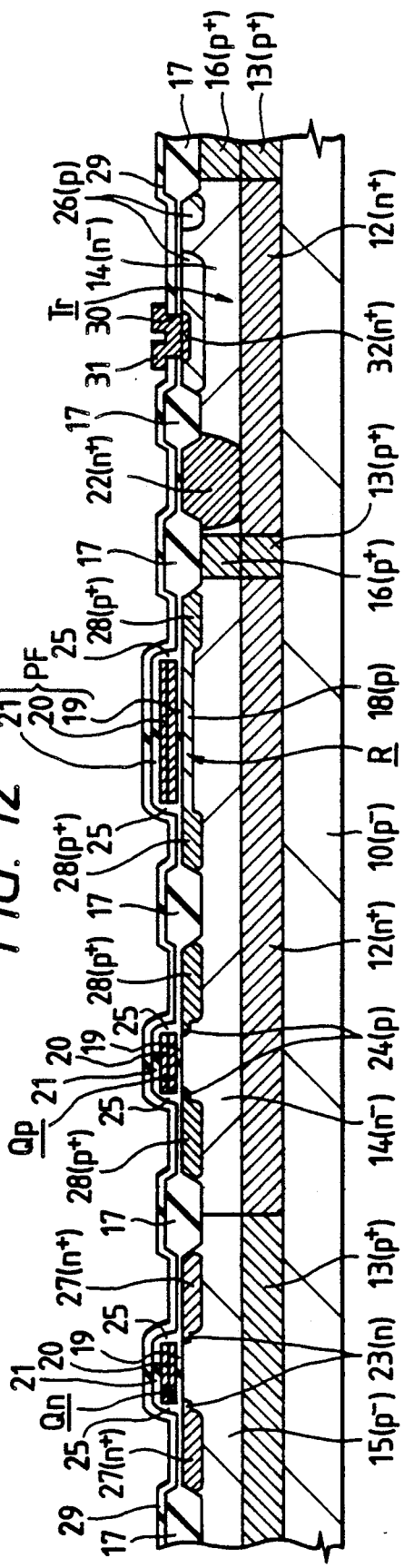

Next, as shown in FIG. 11, the p$^-$-type semiconductor region 28 and the electrode extension p$^-$-type semiconductor region 28 are formed on the main plane of the n$^-$-type well region 14 in the formation regions of the p-channel MISFET Qp and the resistance element R, respectively. The p$^-$-type semiconductor region 28 is used as the source and drain regions. The electrode extension p$^-$-type semiconductor region 28 is used for extending the electrode of the resistance element R. In other words, the electrode extension p$^-$-type semiconductor region 28 can be formed by the same fabrication step as that of the p$^-$-semiconductor region 28. These electrode extension p$^-$-type semiconductor region 28 and the electrode extension p$^-$-type semiconductor region 28 are formed by the ion implantation of B (Boron) in a dose of about $10^{15}$ [atoms/cm$^2$], for example They are formed in self-alignment with respect to the sidewall spacer 25. After this p$^-$-type semiconductor region 28 is formed, the p-channel MISFET Qp is complete. After the electrode extension p$^-$-type semiconductor region 28 is formed, the resistance element R is complete.

Next, the inter-level insulator film 29 is formed on the entire surface of the substrate. This inter-level insulator film is formed primarily in such a manner as to isolate electrically the gate electrode 20 and the conductor layer 20 of the lower layer from the conductor layer 31 of the upper layer. The inter-level insulator film 29 is composed of a silicon dioxide film deposited by CVD, for example.

In the formation region of the bipolar transistor, the inter-level insulator film 29 on the main plane of the p-type semiconductor layer 26 is removed and the emitter opening 30 is formed to expose the surface of the p-type base region. Thereafter, the emitter extension electrode 31 made of a polycrystalline silicon film is formed in such a manner as to come into contact with the main plane of the p-type semiconductor region 26 through the emitter opening 30. The n$^+$-type semiconductor region 32 is thus formed by introducing the n-type impurity into the emitter extension electrode 31 and drive-in diffusing this n-type impurity into the main plane of the p-type semiconductor region 26. The n$^+$-type semiconductor region 32 is used as the n-type emitter region. The n$^+$-type semiconductor region 32 is formed by the ion implantation of As(Arsenic)in a dose of $10^{16}$ [atoms/cm$^2$] into the emitter extension electrode 31, for example. The bipolar transistor Tr is complete after this n$^+$-type semiconductor region 32 is formed.

Though a series of these fabrication steps described above, the hybrid semiconductor integrated circuit device 1 employing the gate array system before the formation of connecting wirings is substantially complete.

Next, the formation step of the connecting wirings for the hybrid semiconductor integrated circuit device employing the gate array system will be explained with reference to FIG. 1.

First of all, the inter-level insulator film 33 is formed on the entire surface of the substrate inclusive of the emitter extension electrode 31. The inter-level insulator films 33 and 29 on the predetermined semiconductor regions 22, 26, 27, 28, the n$^-$-type well region 14 and the emitter extension electrode 31 are removed so as to form the connection holes 34. Though not particularly limited to these regions, the connection holes 34 are formed in such a manner that part thereof come into contact with the sidewall spacers 25, in the formation region of the resistance element R. In other words, the open dimension of the lower part of the connection hole 34 is defined in self-alignment with respect to the sidewall spacer 25 formed on the sidewalls of the protective film PF.

Next, the alloy layer 40 is formed selectively on the surface of each of the semiconductor regions 22, 26, 27, 28, the n$^-$-type well region 14 and the emitter extension electrode 31, whose surfaces are exposed, inside the region defined by the connection holes 34. The alloy layer 40 is formed, for example, by the steps of depositing a Pt film on the entire surface of the substrate by spattering, letting this Pt film react with the contact portion of silicon and removing the Pt film of the unreacted portion by nitrohydrochloric acid. The alloy layer 40 comprises the binary system alloy at this time and is turned into the ternary alloy when the connecting wiring 35 is later formed. After this alloy layer 40 is formed, the Shottky barrier diode device SBD using the alloy layer 40 as the anode region and the n$^-$-type well region 14 as the cathode region is substantially complete.

Next, the connecting wiring 35 formed by the wiring formation step of the first layer is formed in such a manner as to come into contact with the predetermined regions through the connection hole 34 described above. It is formed as the extension electrode 35 in the electrode extension p$^-$-type semiconductor region 28 of the resistance element R. This extension electrode 35 is formed in self-alignment with respect to the protective film PF and to the electrode extension p⁻-type semiconductor region 28 as described already.

Next, the inter-level insulator film 36 and the connection hole 37 are formed sequentially and the connecting wiring 38 by the wiring formation step of the second layer is formed.

After a series of these wiring formation steps are carried out, the hybrid semiconductor integrated circuit device 1 employing the gate array system which has the predetermined logic circuit is complete. The hybrid semiconductor integrated circuit device 1 employing the gate array system may be equipped with a memory circuit in addition to the logic circuit alone.

In the fabrication process of the hybrid semiconductor integrated circuit device including the resistance element R and MISFETs Qn and Qp formed by the p-type semiconductor region 18, the protective film PF is formed by the insulator film 19 and the conductor layer (gate electrode material) 20 on the p-type semiconductor region 18 of the resistance element R by the same fabrication step as that of the gate insulator film 19 and gate electrode 20 of each MISFET Qn, Qp. According to this structure, since the protective film PF can be formed on the resistance element R by the formation step of the gate insulator film 19 and gate electrode 20 of each MISFET Qn, Qp, the number of the fabrication steps of the hybrid semiconductor integrated circuit device 1 can be reduced by the formation step of the protective film PF.

In the fabrication step of the hybrid semiconductor integrated circuit device 1 including the p-type semiconductor region 18 as the resistance element R and the high impurity concentration electrode extension p⁺-type semiconductor region 28 having the same conductivity type as that of the semiconductor region 18 and connected to at least one of the ends of the semiconductor region 18, that are formed on the main plane of the semiconductor substrate 10, and the extension electrode 35 connected to the electrode extension p⁻-type semiconductor region 28, the fabrication process of the invention comprises the step of forming the p-type semiconductor region 18 as the resistance element R on the main plane of the semiconductor substrate 10, the step of forming the protective film PF on the p-type semiconductor region 18, the step of forming the sidewall spacer 25 on the sidewalls of the protective film PF by self-alignment and forming the connection hole 34 encompassed at part of its periphery by the sidewall spacer 25, the step of forming the electrode extension p⁻-type semiconductor region 28 on the main plane of the substrate by self-alignment with respect to the connection hole 34 and the step of connecting the extension electrode 35 to the electrode extension p⁻-type semiconductor region 28 through the connection hole 34. Since the electrode extension p⁻-type semiconductor region 28 of the resistance element R and the extension electrode 35 (or the connection hole 34) can be formed by self-alignment with respect to the sidewall spacer 25 according to this structure, the mask registration margin in the fabrication steps between them can be eliminated. As a result, the occupying area of the resistance element R can be reduced by the area corresponding to the mask registration margin and the integration density of the hybrid semiconductor integrated circuit device 1 can be improved.

Although the present invention has thus been described definitely on the basis of the embodiment thereof, the invention is not particularly limited thereto but can of course be changed or modified in various manners without departing from the gist thereof.

For instance, it is possible to form the resistance element R by the n-type semiconductor region and to form the protective film PF on this n-type semiconductor region.

The present invention can be applied widely to semiconductor integrated circuit devices having resistance elements without being limited particularly to the hybrid semiconductor integrated circuit device employing the gate array system. The present invention is particularly effective when ECL (Emitter Coupled Logic) RAMs equipped with a large number of diffused resistance elements.

In the present invention, it is possible to fabricate the hybrid semiconductor integrated circuit device by a low temperature process and to form the n-type emitter region 32 of the bipolar transistor before the formation step of MISFETs Qn, Qp. In this case, the protective film PF of the resistance element R can be formed by the same layer (by the same fabrication step) as that of the emitter extension electrode 31.

Among the inventions disclosed in this application, the following will represent briefly the effects brought forth by them.

(1) In a semiconductor integrated circuit device having resistance elements, the fluctuation of the resistance values of the resistance elements can be reduced.

(2) The number of the fabrication steps of the semiconductor integrated circuit device can be reduced.

(3) The integration density of the semiconductor integrated circuit device can be improved.

What is claimed is:

1. A method of fabricating a semiconductor integrated circuit device having resistance elements, comprising the steps of:

(1) preparing a semiconductor substrate having a main plane, said semiconductor substrate having a first region in which resistance elements are to be formed, a second region in which MISFETs are to be formed and a third region in which bipolar transistors are to be formed;

(2) forming said resistance elements by introducing an impurity of a first conductivity type into the main plane of said first region;

(3) forming a thin insulator film on the main plane of said first region and on a surface of said resistance elements;

(4) depositing a conductor film, which is to become a gate electrode material of said MISFET, on the entire surface of the main plane of said semiconductor substrate;

(5) forming a gate electrode and a protective film on said insulator film by etching selectively said conductor film for patterning; and (6) forming a diffusion layer region having a high concentration, which is to become part of a collector region of said bipolar transistor, by introducing an impurity of a second conductivity type opposite to said first conductivity type onto the main plane of said third region; wherein said protective film has a function of preventing said impurity for forming said diffusion layer region from being emitted onto said semiconductor substrate and being introduced into said resistance elements.

2. A method of fabricating a semiconductor integrated circuit device having resistance elements according to claim 1, wherein said thin insulator film is a gate insulator film.

3. A method of fabricating a semiconductor integrated circuit device having resistance elements according to claim 2, wherein an impurity concentration of said diffusion layer region is higher than that of said resistance element.

4. A method of fabricating a semiconductor integrated circuit device having resistance elements according to claim 3, wherein said resistance element is constructed in such a manner that a resistor length is greater than a resistor width.

5. A method of fabricating a semiconductor integrated circuit device having resistance elements according to claim 4, wherein said protective film extends in such a manner as to cover an upper surface of said resistance element.

6. A method of fabricating a semiconductor integrated circuit device having resistance elements according to claim 5, wherein a length of said protective film is substantially equal to said resistor length.

* * * * *